United States Patent

Sung

(10) Patent No.: US 10,014,201 B1
(45) Date of Patent: Jul. 3, 2018

(54) MAGNETIC WAFER GRIPPER

(71) Applicant: SolarCity Corporation, San Mateo, CA (US)

(72) Inventor: Edward Sung, Milpitas, CA (US)

(73) Assignee: SolarCity Corporation, San Mateo, CA (US)

(*) Notice: Subject to any disclaimer, the term of this patent is extended or adjusted under 35 U.S.C. 154(b) by 0 days.

(21) Appl. No.: 15/382,568

(22) Filed: Dec. 16, 2016

(51) Int. Cl.
| | | |
|---|---|---|
| *H01L 21/31* | (2006.01) | |
| *H01L 21/677* | (2006.01) | |
| *H01L 21/683* | (2006.01) | |
| *H01L 21/67* | (2006.01) | |
| *C23C 16/458* | (2006.01) | |
| *H01L 21/02* | (2006.01) | |
| *H01L 21/285* | (2006.01) | |
| *H01L 31/18* | (2006.01) | |

(52) U.S. Cl.
CPC .... *H01L 21/67709* (2013.01); *C23C 16/4585* (2013.01); *H01L 21/67167* (2013.01); *H01L 21/67207* (2013.01); *H01L 21/67706* (2013.01); *H01L 21/67742* (2013.01); *H01L 21/683* (2013.01); *H01L 21/0262* (2013.01); *H01L 21/02271* (2013.01); *H01L 21/28556* (2013.01); *H01L 31/18* (2013.01)

(58) Field of Classification Search
CPC ......... H01L 21/67092; H01L 21/67167; H01L 21/67207; H01L 21/67276; H01L 21/67294; H01L 21/67706; H01L 21/67709; H01L 21/67742; H01L 21/683; C23C 16/4585
USPC ...................................................... 438/758
See application file for complete search history.

(56) References Cited

U.S. PATENT DOCUMENTS

| | | |
|---|---|---|
| 4,682,927 A | 7/1987 | Southworth et al. |
| 5,697,749 A | 12/1997 | Iwabuchi et al. |
| 6,224,312 B1 | 5/2001 | Sundar |
| 6,704,998 B1 | 3/2004 | Bonora et al. |
| 7,868,488 B2 | 1/2011 | Lee |
| 8,419,341 B2 | 4/2013 | Hoey et al. |
| 8,851,817 B2 | 10/2014 | Bonora et al. |
| 8,936,293 B2 | 1/2015 | Lada et al. |
| 2011/0225261 A1* | 9/2011 | Matsushita ......... H04L 12/2812 709/217 |

(Continued)

OTHER PUBLICATIONS

Unknown, "Custom Wafer Transfer Systems," Transfer Engineering and Manufacturing, Inc., Fremont, CA, retrieved from the internet on Dec. 14, 2016 at http://www.transferengineering.com/customsys_wafer.php, 2 pages.

*Primary Examiner* — Brook Kebede
(74) *Attorney, Agent, or Firm* — Kilpatrick Townsend & Stockton LLP (57) ABSTRACT

Systems and methods are described for transferring wafers between processing steps in the fabrication of solar cells. The wafers may be processed using a cluster tool including a load-lock, a plurality of processing modules, and a central robot to transfer wafers between the plurality of modules. Each module may include a pedestal including wafer recesses to support the wafers, and puck recesses for supporting ferromagnetic pucks below the wafers. The central robot includes electromagnets for attracting the ferromagnetic pucks toward the electro magnets in order to clamp the wafers between the ferromagnetic pucks and the electromagnets.

20 Claims, 8 Drawing Sheets

(56) References Cited

U.S. PATENT DOCUMENTS

2011/0288674 A1* 11/2011 Sugaya ............. H01L 21/67092
　　　　　　　　　　　　　　　　　　　　　700/110

* cited by examiner

MAGNETIC WAFER GRIPPER

FIELD

The described embodiments relate to devices, systems, and methods that facilitate transfer of wafers during the fabrication of solar cells. In particular, a carrier-less technology using ferromagnetic pucks for transferring wafers between a plurality of processing modules is disclosed.

BACKGROUND

Advances in photovoltaic technology have helped solar energy gain mass appeal among those wishing to reduce their carbon footprint and decrease their monthly energy cost. However, the fabrication of solar cells, used to make solar panels, typically includes various processes that are time-consuming and involve expensive equipment, which can make it costly to mass-produce solar panels.

Fabricating solar cells can be made more efficient by processing many wafers simultaneously. In existing technology, during processing, for example during the deposition of material, a plurality of wafers are transferred into a processing chamber for material deposition using a carrier. The carrier may take the form of a graphite tray with separate compartments for each of the plurality of wafers. The wafers remain on the carrier throughout the processing steps. For example, when a chemical vapor deposition (CVD) step is carried out on the wafer, the carrier is present in the CVD chamber with the wafers.

While using a carrier in this manner has the advantage of being able to transfer many wafers between processing steps, it also has many disadvantages. For example, in order to process many wafers, large carriers are needed. Large carriers are expensive to manufacture, are more difficult to maneuver with a robot, and may damage the robot due to their weight. Further, because some processing steps involve heating the wafers, a great amount of heat energy is transferred to the large carriers. This thermal energy may dissipate in portions of the process where heat is not desirable and may damage equipment. Further, the current carriers are made of graphite which is fragile and prone to breaking. Breaking of carriers is not only costly due to replacement cost, which may be around $20K, but also because it increases production costs due to downtime and cleaning of equipment.

Because solar panel installations require very little post installation maintenance, the viability of these projects often turns on the projected rate of return derived from comparing the fixed value of the energy generated over the lifetime of the system versus the upfront costs of fabrication, and installation. In multi-megawatt projects, where power may be sold to the offtaker for less than $50 per megawatt hour, cost reductions of pennies per watt can be the difference between a project being viable or too expensive. Therefore, engineers are always seeking innovations to lower the cost of fabrication of solar cells without sacrificing speed of manufacture or efficiency of the solar cells.

Accordingly, there is a need for a low cost high efficiency way of transferring wafers during the fabrication of solar cells.

SUMMARY

This disclosure describes various embodiments that relate to methods and apparatuses for transferring wafers between processing steps in the fabrication of solar cells. The wafers may be processed using a cluster tool including a load-lock, a plurality of processing modules, and a central robot to transfer wafers between the plurality of modules, including the load-lock. Each module may include a pedestal including wafer recesses to support the wafers, and puck recesses for supporting ferromagnetic pucks below the wafers. The central robot includes electromagnets for attracting the ferromagnetic pucks toward the electro magnets in order to clamp the wafers between the ferromagnetic pucks and the electromagnets. These and other embodiments are shown and discussed in greater detail in the figures and corresponding detailed description.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Throughout this description, for the purposes of explanation, numerous specific details are set forth in order to provide a thorough understanding of the many aspects and embodiments disclosed herein. It will be apparent, however, to one skilled in the art that the many aspects and embodiments may be practiced without some of these specific details. In other instances, known structures and devices are shown in diagram or schematic form to avoid obscuring the underlying principles of the described aspects and embodiments.

Figure 1A:
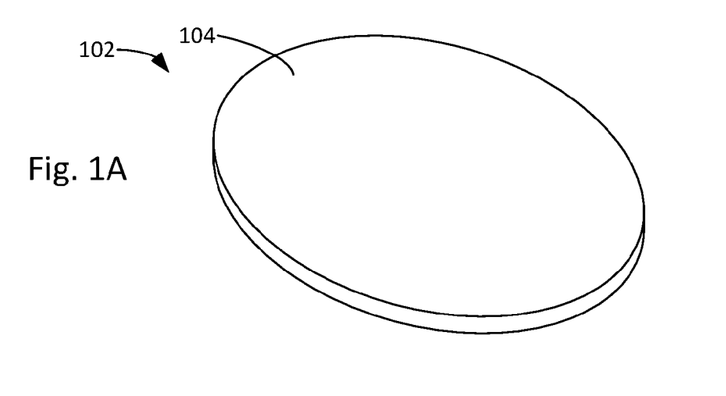
FIG. 1A shows a puck according to various embodiments.
Figure 1B:
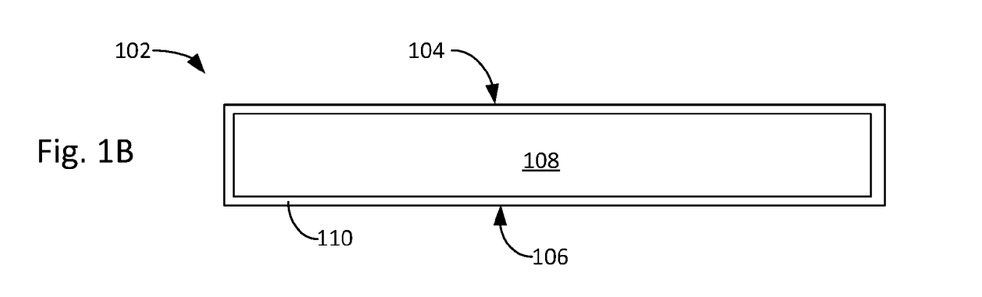
FIG. 1B shows a cross section of a puck according to various embodiments.

FIGS. 1A and 1B show puck 102. As shown, puck 102 may be cylindrical with a circular top surface 104 and a circular bottom surface 106. Top surface 104 and bottom surface 106 may be substantially planar and parallel. In embodiments, puck 102 may have a diameter between, but not limited to, 0.1"-4" and a thickness between, but not limited to, 0.02"-0.25". The diameter of puck 102 may be based on the size and/or weight of a wafer that puck 102 will be used to transfer, as will be discussed below.

In embodiments, the top and bottom surfaces of pucks may have a shape other than circular, for example square, rectangular, or any other polygon or generally round shape In embodiments, the puck may be symmetrical with the top side and bottom side being identical allowing for the puck to be used to transfer a wafer in orientations with either side facing the wafer. In embodiments, the perimeter of the top and/or bottom side may be rounded. A rounded perimeter is beneficial in preventing a sharp edge from contacting and damaging a wafer during transfer, as will be discussed below.

Puck 102 may have ferromagnetic properties. In embodiments, puck 102 includes a ferromagnetic core 108 and non-reactive cladding 110. Ferromagnetic core may include iron, cobalt, nickel, or any other ferromagnetic material or alloy thereof. Non-reactive cladding 110 may be made of a material that is not reactive to the solar cell fabrication processes which puck 102 will be present in. Further, in embodiments, the outside surfaces of puck 102 are made of a material that is non-marring to a wafer during processes of fabricating a solar cell, for example chemical vapor deposition (CVD). For example, non-reactive cladding may be comprised of aluminum. In embodiments, non-reactive cladding 110 is comprised of the same material as the pedestals of the chambers of processing modules. Further in embodiments, puck 102 is configured to match the RF characteristics of the pedestal. In embodiments, core 108 may have a thickness that is the thickness of puck 102 minus two time the thickness of cladding 110, and cladding 110 may be from, but not limited to 0"-0.05" thick. In embodiments, puck may be made of a single metal or alloy which is both ferromagnetic and non-reactive.

In embodiments, it is beneficial for puck 102 to be lightweight so that a robot transferring a plurality wafers and pucks, as will be discussed below, is not damaged due to excessive loading. However, it is also desirable for pucks to have a sufficient mass of material with ferromagnetic properties to be able to be attracted to an electromagnet with sufficient force to support a wafer, as will be discussed below. For example, in embodiments, single robotic arm electromagnets may be configured to be able to lift the weight of the wafer, for example ~0.01 kg for a 6"×6" silicon wafers, plus the weight of puck 102, pucks 102 and may have a mass of between, but not limited to, 0.005 kg-0.1 kg.

Figure 2A:
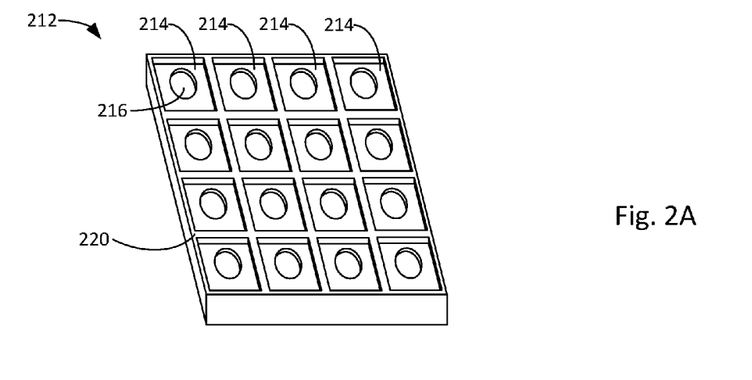
FIGS. 2A and 2B show a pedestal according to various embodiments.
Figure 2B:
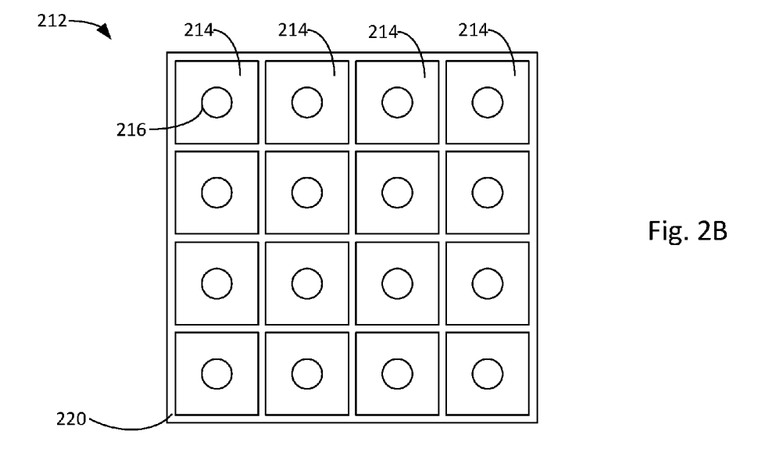
Figure 2C:
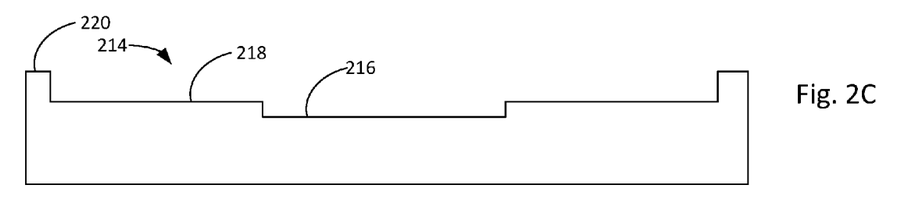
FIG. 2C shows a cross-section of a portion of a pedestal according to various embodiments.

In embodiments, pucks, as disclosed above, are configured to be supported in pedestals. FIGS. 2A-2C show various views of pedestal 212 that may be used with pucks 102. Pedestals 212 may be present in various processing modules used in the fabrication of solar cells. As shown, pedestals 212 may include a plurality of wafer recesses 214 configured to receive and support wafers. During processing, wafers are supporting by pedestal 212 so that one side of the wafer is exposed to processing, for example CVD. Each wafer recess 214 may include puck recess 216 substantially in the center of wafer recess 214. In embodiments, puck recess 216 may be located anywhere in wafer recess 214. Further, in embodiments, two or more puck recesses may be present in a wafer recess.

As shown, wafer recess 214 may include a support surface 218 for supporting a wafer. Support surface 218 may be recessed below top surface 220 of pedestal 212 to a depth corresponding to the thickness of a wafer. For example, depth may be from 0.01"-025". In embodiments, the top of a wafer may be supported above, flush with or below top surface 220.

As shown in cross-section of FIG. 2C, puck recess 216 is recessed below support surface 218. The depth of puck recess 216 may correspond to the thickness of puck 102. In embodiments, puck recess 216 may have a depth exactly corresponding to the thickness of puck 102 so that a wafer supported on support surface 218 will be contacting top surface of puck 102. As shown in FIG. 2B, puck recess 216 may be cylindrical corresponding to cylindrical pucks. Cylindrical pucks and puck recesses are beneficial because pucks may be received in any axially orientation. This is advantageous compared to other shapes, for example squares which will only be receivable within a puck recess with perfect or near perfect alignment. In embodiments, puck recess 216 may have any shape corresponding to the shape of a puck. A puck recess may be dimensioned larger in diameter than a corresponding puck in order to allow the puck to be easily placed into and removed from the puck recess.

In embodiments, pedestal may not include wafer recesses. A plurality of wafers may be supported on a common support surface including one or more wafer recesses for each wafer.

In embodiments, pedestals for use in chambers of processing modules, such as CVD chambers, may be made of materials compatible with the process performed in the chamber. For example, pedestals may be made of alloys of aluminum, grades of aluminum oxide, and/or grades of aluminum nitride. Further, because ferromagnetic pucks may be used to transfer wafers, as will be discussed in greater detail below, in embodiments, pedestals are made from a non-ferromagnetic material so that magnets attracting pucks are not attracted to the pedestal.

In embodiments, to ensure that the bottom side of a wafer and a puck do not react during certain processes performed on the top side of the wafer, the pedestal may include a trickle purge line directed into the wafer recess and/or the puck recess. The trickle purge line may release an inert gas into the recesses in order have a constant flow of gas out of the recesses in order to prevent processing gases and materials from entering the recesses and reacting with the puck or bottom side of the wafer. Further, the trickle purge line may be used to actively regulate the temperature of the wafer during processing of the wafer.

As discussed, pedestals may be located within a chamber of a processing module, such as CVD module. In embodiments, pedestals may be present in other modules used during the fabrication process for solar cells. For example, pedestals may be present in load-lock modules used for loading, and unloading, wafers into, and out of, a cluster tool. In embodiments, pedestals in non-processing modules may have different properties than pedestals in processing modules. For example, pedestals not used in heating applications may be made of materials less suitable for high heat. Further for example, in embodiments, pedestals used in load-lock modules may be portable and configured to be loaded into the load-lock module by a robot or manually. For example, a pedestal may be in the form of a carrier tray. A carrier tray pedestal may be loaded with a plurality of wafers and pucks in a staging area and then transported to the load-lock module of a cluster tool.

Figure 3A:
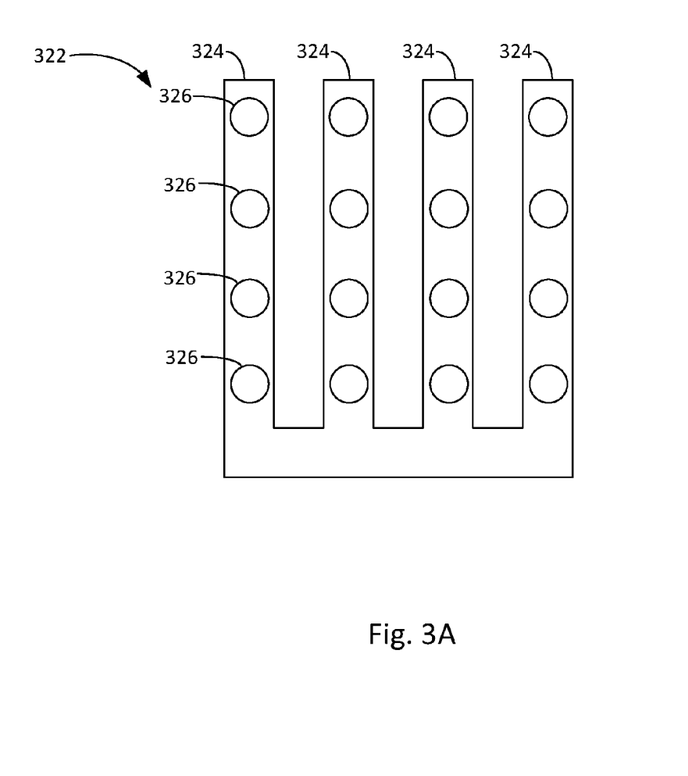
FIG. 3A shows a robotic arm array according to various embodiments.
Figure 3B:
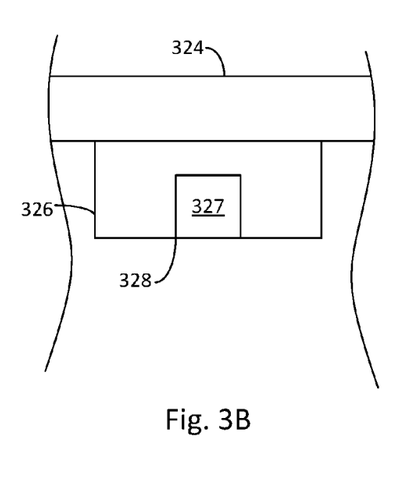
FIG. 3B shows a portion of robotic arm array according to various embodiments.

As shown in FIGS. 2A and 2B, pedestal 212 may include a 4×4 grid of wafer recesses 214, however in embodiments any size grid of wafer recesses, or puck recesses, may be used. For example, 10×10 or 20×20. The size of the grid may be based on the maximum batch processing capability of the processing module, the largest grid size that still meets process non-uniformity requirements, the size and weight of the wafer, the size of the access to the chambers of the processing modules and the load capacity of the robot transferring the wafers and pucks. As shown, wafer recesses are square which may correspond to square wafers, however other shapes of wafers may be used and in embodiments, wafer recesses have corresponding shapes to the wafers which they support. In embodiments, wafer recesses may be arranged in patterns other than X-Y grids, for example radial, honeycomb, or X-Y patterns that still fit within the confines of a pedestal, such as a circular pedestal that has square wafers FIGS. 3A-3B show various views of embodiments of a robotic arm array 322. Robotic arm array 322 may be attached to a central robot of a cluster tool, as described below. The central robot may include one or multiple arms and may be configured to move robotic arm array 322 with multiple degrees of freedom. For example, 2 to 6, or more, degrees of freedom. As shown, robotic arm array 322 may include a plurality of arms 324. As shown, each arm 324 may be parallel. Each arm 324 may include a plurality of magnetic assemblies 326. The spacing of arms 324 and the spacing of magnetic assemblies 326 may correspond to the grid of puck recesses of a pedestal that the robotic arm array will be used with. As shown, robotic arm array 322 includes a 4×4 arrangement of magnetic assemblies 326 corresponding to the 4×4 arrangement of puck recesses 216 of pedestal 212, shown in FIG. 2A. In embodiments, arms and magnetic assemblies may be arranged in any arrangement corresponding to the arrangement of puck recesses in a pedestal.

As shown, magnetic assemblies 326 may be cylindrical. Magnetic assemblies 326 may include an electromagnet 327 actuated by a controller. Each magnetic assembly 326 of robotic arm array 322 may be actuated individually, in groups, or all together. Magnetic assemblies 326 may be configured to attract puck 102, as disclosed above, in order to clamp a wafer between a contact surface 328 of magnetic assembly 326 and puck 102. The clamped puck may be used to transfer wafers to and from pedestals within modules used during fabrication of solar cells. Accordingly, in embodiments, contact surface 328 is sized substantially the same size as top surface of puck 102. Contact surface 328 may include a non-marring coating, for example Teflon, PEEK, Ultem, PBI, or highly polished ceramics and metals.

Figure 3C:
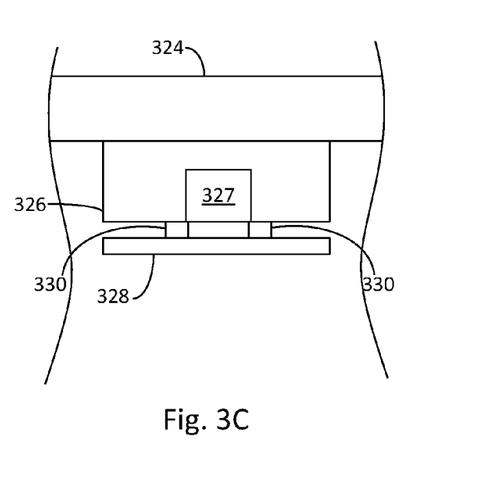
FIG. 3C shows a portion of robotic arm array according to various embodiments.

As will be discussed in greater detail below, contact surface 328 may be placed in contact with a wafer during the process of transferring the wafer. Wafers may be extremely fragile, therefore it is important to reduce the initial impact force of contacting the wafer in order to avoid damaging the wafer. In embodiments, as shown in FIG. 3C, in order to reduce the impact force, contact surface 328 may include spring dampers 330 to allow for magnetic assembly to dampen impact force during initial contact with a wafer.

Figure 4A:
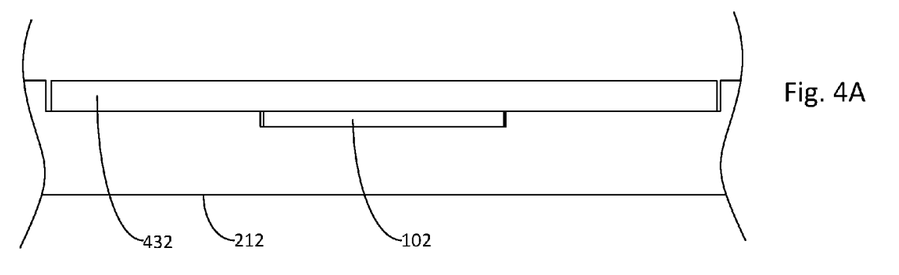
FIGS. 4A-4E show steps of a process for lifting a wafer from a pedestal according to various embodiments.
Figure 4B:
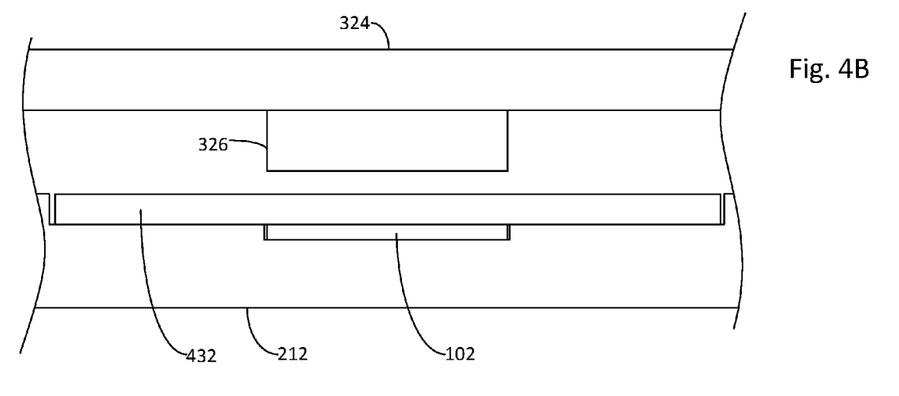

FIGS. 4A-4E, show steps of a process of transferring wafer 432 from pedestal 212 using magnetic assembly 326 and puck 102. The steps of FIGS. 4A-4E show a portion of arm 324 of robotic arm array 322, and a single wafer recess of pedestal 212. In embodiments, each of the steps may be performed simultaneously for each wafer in a pedestal. As shown in FIG. 4A, wafer 432 is positioned within a wafer recess of pedestal 212 and supported on the support surface. Below wafer 432 in a puck recess of pedestal 212 is puck 102. As shown, the puck recess of pedestal 212 and puck 102 may have the same depth so that wafer 432 is contacting puck 102. In order to move wafer off of pedestal 212, arm 324, of robotic arm array 322, is positioned over wafer 432 and magnetic assembly 326 is positioned to be aligned over puck 102, as shown in FIG. 4B. As noted, a contact surface of a magnetic assembly may be the same size as top surface of puck. Alignment of a puck and a magnetic assembly may be done with machine vision, motor encoders, or other sensing and automated alignment techniques known in the art.

Figure 4C:
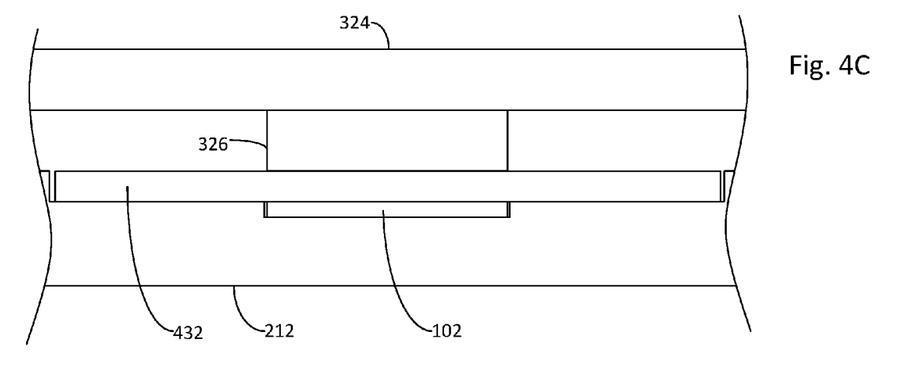

As shown in FIG. 4C, once magnetic assembly 326 is aligned over puck 102, arm 324 is lowered until contact surface makes contact with wafer 432. As noted, magnetic assembly may include a spring damped contact surface so that initial contact does not damage the wafer. Once magnetic assembly 326 is in contact with wafer 432, electromagnet of magnetic assembly 326 is turned on in order to attract puck 102, positioned below wafer 432, toward magnetic assembly 326. The magnetic attraction clamps wafer 432 between magnetic assembly 326 and puck 102.

Figure 4D:
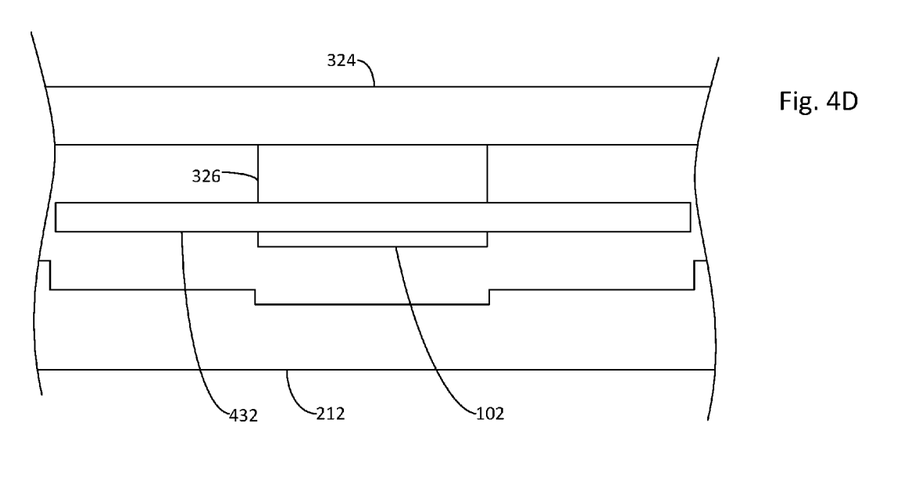
Figure 4E:
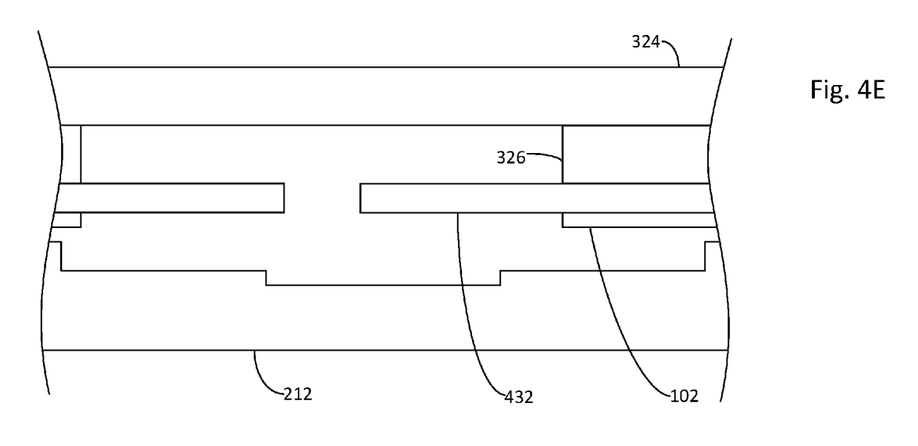

As shown in FIG. 4D, once wafer 432 is clamped between magnetic assembly 326 and puck 102 due to the magnetic attraction, arm 324 is lifted up and away from pedestal 212 at least a distance which causes the bottom surface of puck 102 to be above the top surface of pedestal 212. Once clear, arm 324 may be moved away from pedestal 212, and wafer 432 may be transferred toward another pedestal in another module, as shown in FIG. 4E.

FIGS. 4A-4E show a wafer being transferred from a pedestal. In order to transfer a wafer to a pedestal, the steps are substantially performed in reverse. Specifically, a wafer clamped between an electromagnet assembly and a puck may be positioned over a pedestal so that the puck is aligned over a puck recess of the pedestal. The robotic arm is lowered so that the puck is within the puck recess and the wafer is supported on the support surface of the pedestal. Electromagnet of magnetic assembly is then turned off and the puck is no longer attracted to the magnetic assembly. The puck therefore no longer clamps the wafer and is now supported by the puck recess. The arm is raised away from the wafer and moved away leaving the wafer and puck behind on the pedestal.

FIGS. 4A-4E relate to transferring a single wafer and puck. However, this process may be performed simultaneously with multiple magnetic assemblies of a robotic arm array being used to clamp and transfer multiple wafers and pucks to and from pedestals.

Figure 5A:
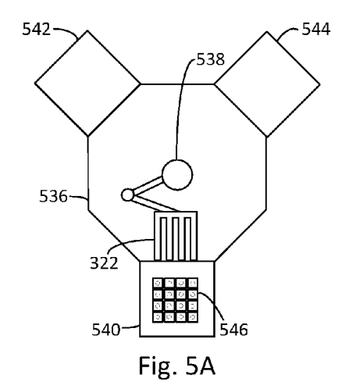
FIGS. 5A-5R show steps of processes for transferring sets of wafers to different modules of a cluster tool according to various embodiments.
Figure 5B:
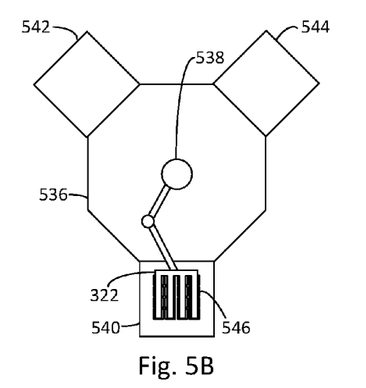
Figure 5C:
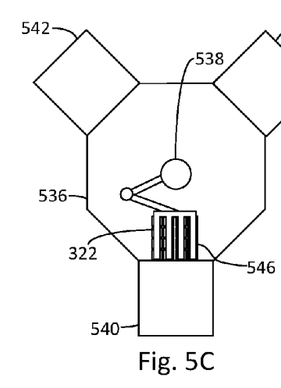
Figure 5D:
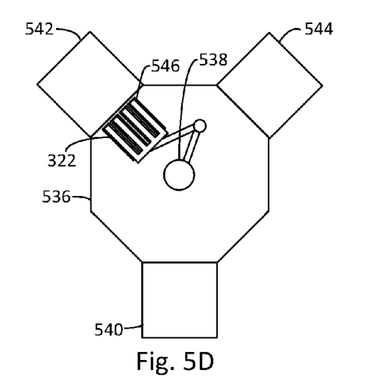
Figure 5E:
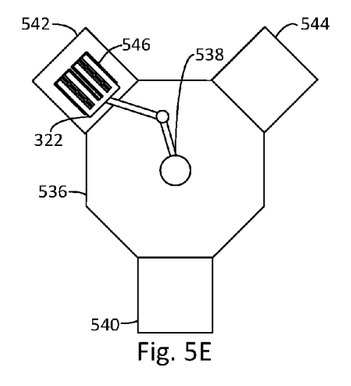
Figure 5F:
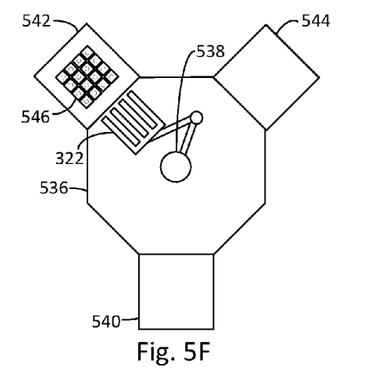

As noted, the steps shown in FIGS. 4A-4E may be used to simultaneously transport multiple wafers between pedestals in a cluster tool during the fabrication of solar cells. FIGS. 5A-5R show steps of transferring multiple wafers to different positions in a cluster tool, using the pucks, pedestals, robotic arm array, and methods discussed above.

As shown in FIG. 5A, cluster tool 534 includes central chamber 536 including central robot 538, as discussed above, load-lock module 540, first processing module 542, and second processing module 544. In embodiments, cluster tool 534 may include any number of modules of any type, for example CVD, etching, load-lock, measuring, cooling, or heating. Each module may include a pedestal as discussed above, not shown in FIGS. 5A-5R for clarity purposes.

Central chamber 536 may be kept under vacuum and each module may include a port, between central chamber 536 and module, which is sealable to maintain the vacuum. Load-lock module 540 includes an access door allowing for wafers to be loaded into load-lock module from outside of cluster tool 534. In embodiments, load-lock module may include a pedestal and pucks, as disclosed above, and wafers may be manually placed into each wafer recess. In embodiments, load-lock module 540 may include a loading robot used to move wafers from a cassette to wafer recesses of a pedestal in load-lock module 540. In embodiments, load-lock module 540 may include a robot for placing pucks in puck recesses of a pedestal within load-lock module. In embodiments, as noted above, pedestals may be portable, and a pedestal carrying wafers and pucks may be loaded into load-lock module through an access door.

To introduce wafers 546, including corresponding pucks 102, into central chamber 536 in order to perform processing steps on wafers 546, the access door of load-lock module 540 is closed and the atmosphere from load-lock module 540 is evacuated, as shown in FIG. 5A. A port between load-lock module 540 and central chamber 536 is opened and central robot 538 moves robotic arm array 322 into load-lock module 540, as shown in FIG. 5B. The steps described in FIGS. 4A-E may be performed and wafers 546 may be clamped between pucks and magnetic assemblies, lifted out of wafer recesses and moved into central chamber 536 with robotic arm array 322, as shown in FIG. 5C. Wafers 546 may then be moved to a portion of central chamber 536 corresponding to another module, for example first processing module 542, as shown in FIG. 5D. The port of first processing module 542 may be opened and wafers 546 may be placed into first processing module 542 and aligned over and placed within wafer recesses of a pedestal, as described above and as shown in FIG. 5E. With each puck within a puck recess and each wafer supported on a support surface of a wafer recess, the magnets of the magnetic assemblies are turned off and robotic arm array 322 is raised and removed from first processing module 542 leaving wafers 546, and corresponding pucks, left within first processing module 542, as shown in FIG. 5F. The port of first processing module 542 is closed and wafers 546 within first processing module 542 may be processed with the pucks positioned in the pedestal below wafers 546. As will be discussed below, while one set of wafers are within a module, central robot 538 may be used with robotic arm array 322 to move other sets of wafers between pedestals in modules of cluster tool 534.

Figure 5G:
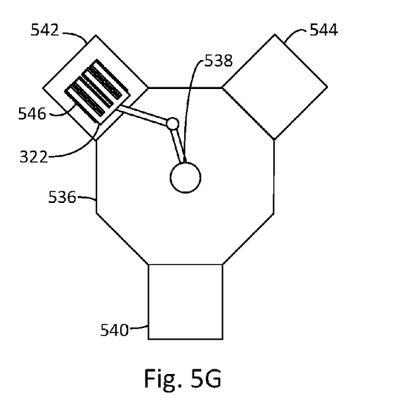
Figure 5H:
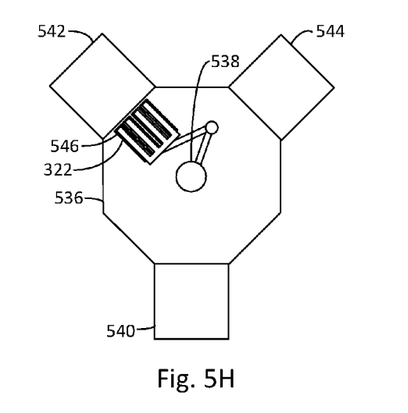
Figure 5I:
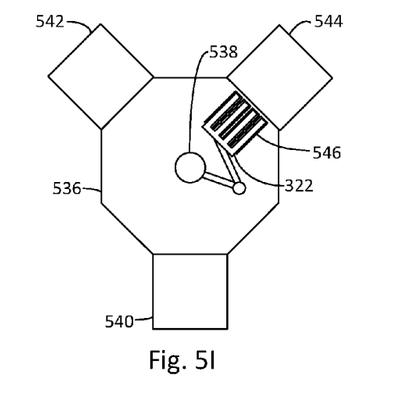
Figure 5J:
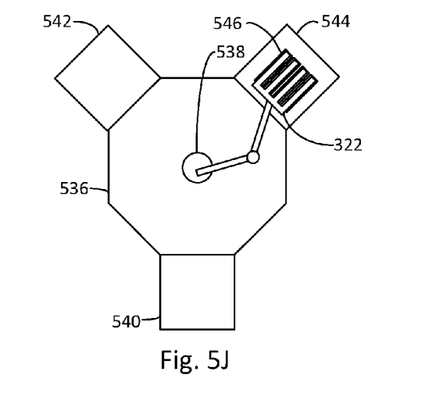
Figure 5K:
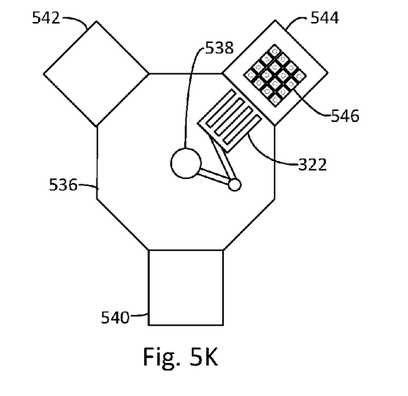

Once processing within first processing module 542 is complete, the processing chamber may be opened and robotic arm array 322 may be positioned over wafers 546, as shown in FIG. 5G, and the processes discussed relating FIGS. 4A-E may be carried out in order to move wafers 546 and pucks into central chamber 536, as shown in FIG. 5H. Central robot 538 may then rotate in order to move wafers 546, and corresponding pucks, in front of another module, for example second processing module 544 and wafers 546 may be loaded into second processing module 544 for processing, as shown in FIG. 5I-5K.

Figure 5L:
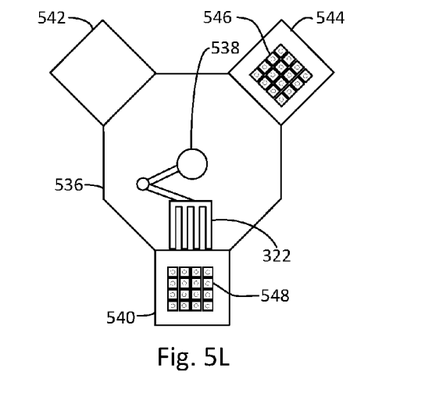
Figure 5M:
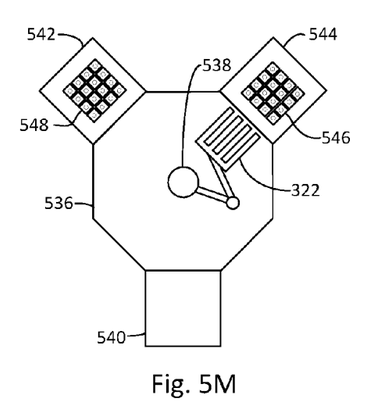
Figure 5N:
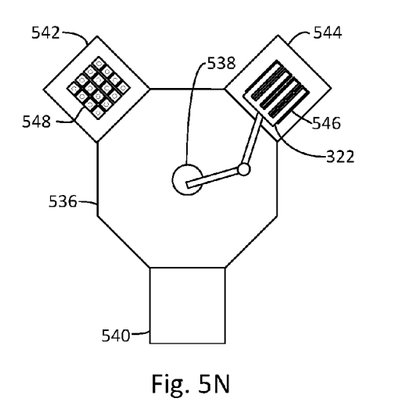
Figure 5O:
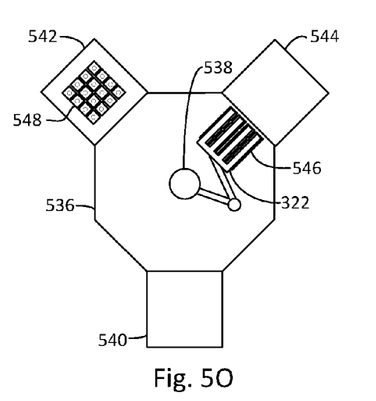
Figure 5P:
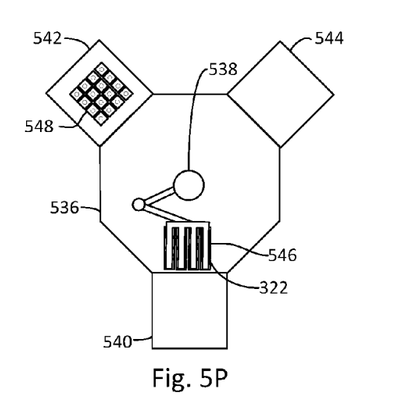
Figure 5Q:
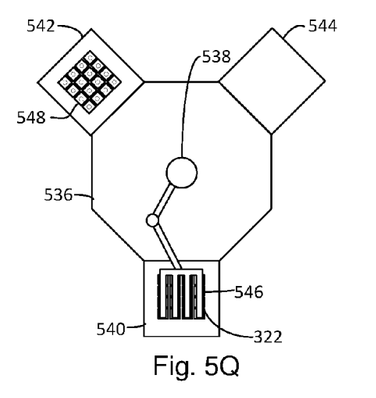
Figure 5R:
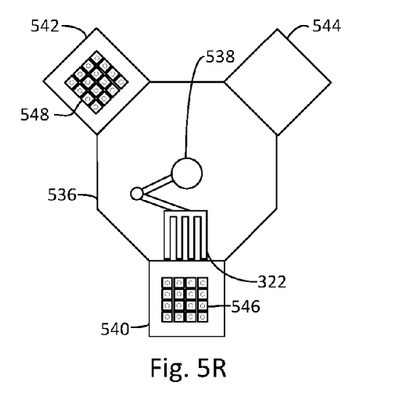

In embodiments, while a first set of wafers are within a module, for example being processed in a processing module, central robot 538 may be used to transfer a second set of wafers between modules. For example, while wafers 546 are being processed in second processing module 544 another set of wafers 548 may be placed in load-lock module 540, as shown in FIG. 5L. The steps shown in FIGS. 5A-F may be repeated in order to load second set of wafers 548 into first processing module 542. As shown in FIG. 5M, while second set of wafers 548 is within first processing module 542, wafers 546 in second processing module 544 may transported out of second processing module 544 to another module, for example load-lock module 540, as shown in FIGS. 5M-5R. In embodiments, wafers may be transferred from any module to any other available module in the cluster tool in order to perform the processing needed to fabricate solar cells.

While the examples described above relate to two sets of wafers being transferred between three modules, in embodiments, central robot may be used to move any number of sets of wafers between any number of modules. In embodiments, at least one pedestal must be empty in order to have a location to transport wafers, from another pedestal, to the next pedestal.

While the technology disclosed is particularly advantageous for use in vacuum environments, where other gripper technologies may not be used, for example Bernoulli grippers, the technology may be used in non-vacuum environments. Further, the methods and apparatuses described herein may be used in any process of transferring wafers, and similar shaped workpieces, and is not limited to cluster tools. For example, in embodiments, in-line fabrication equipment may include a gantry like device including a magnetic assembly to move a wafer in a first pedestal of a first in-line module to a second pedestal of a second in-line module. In embodiments, multiple pucks and/or magnetic assemblies may be used to move a single wafer. In embodiments, wafers may be flipped over and placed in a pedestal so that the opposite side of the wafer contacts the puck during transfer between modules.

The above techniques are further beneficial because contamination of pucks may be avoided because pucks are covered during processing. Therefore, the above methods result in high throughput by allowing wafers to be transferred between different types of CVD chambers, e.g. N-type and P-type, without having to change pucks due to cross-contamination. This is advantageous over previous methods wherein wafers would have to be moved to a different carrier in order to be processed in a different type of CVD chamber.

Further, the above methods and apparatuses are advantageous because they lead to reduced weight, allowing for faster more agile robots to be used compared to technologies which use heavy carriers, as discussed above. Further, due to the small size of pucks, problems associated with heat dissipation of carriers are reduced or eliminated.

The examples discussed have related to fabrication of solar cells, however, the technology may be used during the fabrication of any device which uses wafers, or similar workpieces. For example, the technology may be used in the manufacture of integrated circuit, displays, processors, chips, or any type of solid-state electronic device.

The various aspects, embodiments, implementations or features of the described embodiments can be used separately or in any combination. The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

The use of the terms "a" and "an" and "the" and similar referents in the context of describing the technology (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, or gradients thereof, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the technology and does not pose a limitation on the scope of the technology unless otherwise claimed. No language in the specification should be construed as indicating any non-claimed element as essential to the practice of the technology.

Preferred embodiments of are described herein, including the best mode known to the inventors for carrying out the technology. The technology is susceptible to various modifications and alternative constructions, and certain shown exemplary embodiments thereof are shown in the drawings and have been described above in detail. Variations of those preferred embodiments, within the spirit of the present technology, will be apparent to those of ordinary skill in the art upon reading the foregoing description. The inventors expect skilled artisans to employ such variations as appropriate, and the inventors intend for the technology to be practiced otherwise than as specifically described herein. Accordingly, it should be understood that there is no intention to limit the technology to the specific form or forms disclosed, but on the contrary, this technology includes all modifications and equivalents of the subject matter recited in the claims appended hereto as permitted by applicable law. Moreover, any combination of the above-described elements in all possible variations thereof is encompassed by the technology unless otherwise indicated herein or otherwise clearly contradicted by context.

What is claimed is:

1. A method of transporting a wafer comprising:
   with a robotic arm, positioning an electromagnet assembly with a contact surface, proximate to a wafer in a first chamber; and
   attracting a ferromagnetic puck positioned on a side of the wafer opposite the electromagnet assembly with the electromagnet assembly in order to clamp the wafer between the contact surface and the ferromagnetic puck.

2. The method of claim 1, wherein the first chamber comprises a pedestal comprising a puck recess configured to receive the ferromagnetic puck on the side of the wafer opposite the electromagnet assembly, and
   wherein prior to attracting the ferromagnetic puck, the ferromagnetic puck is located within the puck recess.

3. The method of claim 2, further comprising:
   after securing the wafer against the contact surface, with the robotic arm, transferring the wafer to a second chamber, the second chamber comprising a second pedestal with a second puck recess; and
   with the robotic arm, positioning the wafer to contact the second pedestal with the puck within the second puck recess.

4. The method of claim 1, wherein prior to positioning the electromagnet assembly proximate to the wafer, the wafer is contacting the ferromagnetic puck.

5. The method of claim 1, wherein the ferromagnetic puck comprises a ferromagnetic core, and a non-ferromagnetic coating.

6. The method of claim 1, wherein prior to attracting the ferromagnetic puck, the electromagnet assembly is positioned to contact the wafer with the contact surface.

7. The method of claim 6, wherein the contact surface comprises a damping element to damp the contact.

8. The method of claim 1, wherein the first chamber is a processing chamber, and
   wherein prior to positioning the electromagnet assembly proximate to the wafer, a process is performed on a side of the wafer opposite the ferromagnetic puck.

9. The method of claim 1, further comprising:
   with the robotic arm, positioning a second electromagnet assembly with a second contact surface, proximate to a second wafer in the first chamber; and
   attracting a second ferromagnetic puck positioned on a side of the second wafer opposite the second electromagnet assembly with the second electromagnet assembly in order to clamp the second wafer between the second contact surface and the second ferromagnetic puck.

10. A system comprising:
    a robotic arm including a first electromagnet assembly with a first contact surface;
    a first ferromagnetic puck; and
    a pedestal including a first puck recess configured to receive the first ferromagnetic puck, wherein the pedestal is configured to support a first wafer, and
    wherein the first electromagnet assembly is configured to attract the first ferromagnetic puck in order to clamp the first wafer between the first ferromagnetic puck and the first contact surface.

11. The system of claim 10, further comprising:
    a second ferromagnetic puck;
    wherein the robotic arm further comprises a second electromagnet assembly with a second contact surface,
    wherein the pedestal is further configured to support a second wafer and further includes a second puck recess configured to receive the second ferromagnetic puck, and
    wherein the second electromagnet assembly is configured to attract the second ferromagnetic puck in order to clamp the second wafer between the second ferromagnetic puck and the second contact surface.

12. The system of claim 11, wherein the robotic arm is configured to transfer the first and second wafers from a first processing chamber to a second processing chamber with the first and second wafers clamped between the first and second ferromagnetic pucks and the first and second contact surface.

13. The system of claim 10, wherein the robotic arm further comprises a plurality of electromagnet assemblies, including the first electromagnet assembly, arranged in a first grid pattern; and
    wherein the pedestal further comprises a plurality of puck recesses, including the first puck recess, arranged in a second grid pattern, corresponding to the first grid pattern.

14. The system of claim 10, wherein the first ferromagnetic puck comprises outside surface composed of a first material, and wherein the pedestal is composed of the first material.

15. The system of claim 10, wherein the pedestal is located within a chemical vapor deposition chamber, and
    wherein the chemical vapor deposition is configured to deposit material on a first side of the first wafer with the first ferromagnetic puck positioned in the first puck recess between a second side of the first wafer, opposite the first side, and the pedestal.

16. A pedestal in a wafer processing module, comprising:
    a support surface configured to support a wafer; and
    a first puck recess configured to support a ferromagnetic puck between the pedestal and the wafer.

17. The pedestal of claim 16, further comprising:
    a first wafer recess, wherein the first puck recess is positioned substantially in the center of the first wafer recess.

18. The pedestal of claim 16, further comprising:
a plurality of wafer recesses, including the first wafer recess; and
a plurality of puck recesses, including the first puck recess,
wherein each of the plurality of wafer recesses include one of the plurality of puck recesses, and
wherein the plurality of wafer recesses are oriented in a grid pattern, including rows and columns of wafer recesses.

19. The pedestal of claim 16, wherein the support surface and puck recess are composed of the same material as an outside surface of the ferromagnetic puck.

20. The pedestal of claim 16, wherein the pedestal is located within a chemical vapor deposition chamber.

\* \* \* \* \*